(12) United States Patent
You et al.

(10) Patent No.: US 10,899,238 B2
(45) Date of Patent: Jan. 26, 2021

(54) CONTROL APPARATUS INCLUDING A KEY HOLD FUNCTION OF SUPPLYING POWER TO A CONTROLLER AND CONTROL METHOD THEREOF

(71) Applicants: Hyundai Motor Company, Seoul (KR); Kia Motors Corporation, Seoul (KR)

(72) Inventors: Chang Seok You, Gyeonggi-do (KR); Min Su Kang, Gyeonggi-do (KR); Sung Do Kim, Seoul (KR); Dong Hun Lee, Gyeonggi-Do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 303 days.

(21) Appl. No.: 16/002,687

(22) Filed: Jun. 7, 2018

(65) Prior Publication Data

US 2019/0176644 A1 Jun. 13, 2019

(30) Foreign Application Priority Data

Dec. 7, 2017 (KR) ........................ 10-2017-0167758

(51) Int. Cl.
| | |
|---|---|
| *B60L 50/64* | (2019.01) |
| *G01R 31/396* | (2019.01) |
| *B60L 58/19* | (2019.01) |
| *B60L 3/00* | (2019.01) |
| *B60L 3/12* | (2006.01) |
| *B60L 1/00* | (2006.01) |
| *G01R 31/50* | (2020.01) |

(52) U.S. Cl.
CPC ................. *B60L 50/64* (2019.02); *B60L 1/00* (2013.01); *B60L 3/0084* (2013.01); *B60L 3/12* (2013.01); *B60L 58/19* (2019.02); *G01R 31/396* (2019.01); *G01R 31/50* (2020.01)

(58) Field of Classification Search
CPC .......... B60L 50/64; B60L 3/0084; B60L 3/12; B60L 1/00; B60L 58/19; G01R 31/50; G01R 31/396
See application file for complete search history.

(56) References Cited

U.S. PATENT DOCUMENTS

| | | | |
|---|---|---|---|
| 10,439,545 B2 * | 10/2019 | Hata | B60W 50/023 |
| 10,513,200 B2 * | 12/2019 | Kim | B60L 58/12 |
| 10,710,468 B2 * | 7/2020 | Teng | H02J 7/00 |
| 10,782,350 B2 * | 9/2020 | Huh | G01R 19/16504 |

(Continued)

FOREIGN PATENT DOCUMENTS

KR 101315773 B1 10/2013

*Primary Examiner* — Mohammad K Islam

(74) *Attorney, Agent, or Firm* — Mintz Levin Cohn Ferris Glovsky and Popeo, P.C.; Peter F. Corless

(57) ABSTRACT

A control apparatus of a vehicle can include: a controller configured to control an operation function of the vehicle; and a power supply unit configured to supply power to the controller or to cut off power supply thereto. The power supply unit can include a) a key hold circuit storing a key hold-on/off state of the key hold circuit corresponding to a key hold function of supplying power to the controller after the control apparatus shuts down and b) a power supply determiner determining whether to supply the power to the controller.

11 Claims, 3 Drawing Sheets

(56) References Cited

U.S. PATENT DOCUMENTS

| | | | | |
|---|---|---|---|---|
| 2006/0287805 A1* | 12/2006 | Enomoto | ............... | F02D 41/26 |
| | | | | 701/113 |
| 2011/0205017 A1* | 8/2011 | Lazzara | ................ | B60R 25/06 |
| | | | | 340/5.64 |
| 2013/0103959 A1* | 4/2013 | Hatta | ....................... | G06F 1/26 |
| | | | | 713/310 |

* cited by examiner

CONTROL APPARATUS INCLUDING A KEY HOLD FUNCTION OF SUPPLYING POWER TO A CONTROLLER AND CONTROL METHOD THEREOF

CROSS REFERENCE TO RELATED APPLICATION

The present application claims the benefit of priority to Korean Patent Application No. 10-2017-0167758, filed on Dec. 7, 2017 in the Korean Patent Office, the entire contents of which are incorporated herein by reference if fully set forth herein.

BACKGROUND OF THE DISCLOSURE

1. Technical Field

The present disclosure relates to a control apparatus and a method for controlling the same, and more particularly, to detection of a malfunctioning key hold function of supplying power to a controller and a control method according thereto.

2. Description of the Prior Art

The functionality of controllers used in vehicles has expanded as electronic control systems have increased. For example, some controllers perform post-processing functions after turning off the ignition of a vehicle.

Generally, a controller of a vehicle supplies power to a CPU (Central Processing Unit) or cuts off the power supply according to ignition-on/off signals by a driver. However, in a case where a certain function is required to be controlled even when the vehicle ignition is turned off, it is necessary to supply power to the controller in order to perform post-processing after the ignition-off signal has been input.

In order to perform the post-processing, a key hold function is applied, in which power is supplied to the controller when the vehicle ignition is turned off. Therefore, an internal power supply circuit supplies power to the CPU for the key hold function after the controller shuts down.

However, if there is a problem in the key hold function of the power supply circuit in the controller, or if a problem, occurs in the communication means between the CPU and the power supply circuit, it becomes impossible to properly perform the key hold function. In particular, if the key hold that has been turned on by the power supply circuit is not turned off at a proper timing, e.g., due to malfunction, the controller continues to be supplied with power while the vehicle shuts down. Therefore, dark current increases in the vehicle, and a low-voltage battery (12V) is discharged as a result.

It should be understood that the above description of the background art is merely intended for the purpose of facilitating the understanding of the background of the present disclosure, and is not to be construed as being an admission of the prior art known to those skilled in the art.

SUMMARY OF THE DISCLOSURE

The present disclosure has been proposed in order to solve the above problems by providing a method for detecting malfunction of a key hold function and performing an emergency control according thereto.

According to embodiments of the present disclosure, a control apparatus of a vehicle may include: a controller configured to control an operation function of the vehicle; and a power supply unit configured to supply power to the controller or to cut off power supply thereto, wherein the power supply unit comprises a) a key hold circuit storing a key hold-on/off state of the key hold circuit corresponding to a key hold function of supplying power to the controller after the control apparatus shuts down and b) a power supply determiner determining whether to supply the power to the controller.

The power supply determiner may determine whether to supply the power to the controller based on a user input signal or the key hold-on/off state of the key hold circuit.

The power supply determiner may determine to supply the power to the controller when the user input signal is in the on state or the key hold circuit is in the on state.

The power supply determiner may determine to cut off the power supply to the controller when the user input signal is in the off state and the key hold circuit is in the off state.

The controller may include a key hold configurator determining on/off conditions of the key hold function and transmitting a key hold-on/off command to the key hold circuit.

The key hold configurator may transmit a key hold-off command to the key hold circuit when the controller completes execution of a predetermined operation after the control apparatus shuts down.

The controller may include a key hold malfunction determiner detecting a malfunction of the key hold function, and the key hold malfunction determiner may identify a key hold-on/off state of the key hold circuit and may detect the malfunction of the key hold function based on the identified key hold-on/off state.

The controller may include a key hold configurator determining on/off conditions of the key hold function and transmitting a key hold-on/off command to the key hold circuit, and the key hold malfunction determiner may detect that the key hold function malfunctions when the key hold circuit is in the on state before receiving a key hold-on command from the key hold configurator.

The controller may include a key hold configurator for determining on/of conditions of the key hold function and transmitting a key hold-on/off command to the key hold circuit, and the key hold malfunction determiner may detect that the key hold function malfunctions when the key hold circuit is in the off state after receiving a key hold-on command from the key hold configurator.

The control apparatus may further include a battery configured to supply power to the power supply unit, and the controller may include a battery relay-on/off controller configured to control an on/off switch of a battery relay provided between the battery and the power supply unit.

The controller may include a key hold malfunction determiner detecting a malfunction of the key hold function, and when the key hold malfunction determiner detects that the key hold function malfunctions, a battery relay-on/off controller may control the battery relay so as to turn off the battery relay when the controller completes execution of a predetermined operation after the control apparatus shuts down.

The controller can be connected to the power supply unit by a serial peripheral interface (SPI), and the controller and the power supply unit can transmit signals to each other via the connection.

Further, a method for controlling a control apparatus of a vehicle according to embodiments the present disclosure may include: booting a controller configured to control an operation function of the vehicle; detecting a malfunction of a key hold function of supplying power to the controller by a power supply unit after the control apparatus shuts down; and when the malfunction of the key hold function is detected, controlling a battery relay, which is provided between a battery and a power supply unit for supplying power to the controller, so as to turn off the battery relay when the controller completes execution of a predetermined operation after the control apparatus shuts down.

The detecting of the malfunction of the key hold function may include detecting that the key hold function malfunctions when a key hold circuit is in a key hold-on state before transmission of a key hold-on command by a key hold configurator.

The detecting of the malfunction of the key hold function may include detecting that the key hold function malfunctions when a key hold circuit is in a key hold-off state after transmission of a key hold-on command by a key hold configurator.

According to a control apparatus of the present disclosure, it is possible to detect a malfunction of a key hold function or communication means.

In addition, even when the key hold function malfunctions, it is possible to prevent the battery from being discharged by means of emergency control while the vehicle shuts down.

As a result, the reliability and stability of vehicle control can be improved.

BRIEF DESCRIPTION OF THE DRAWINGS

The above and other aspects, features, and advantages of the present disclosure will be more apparent from the following detailed description taken in conjunction with the accompanying drawings, in which.

Figure 1:
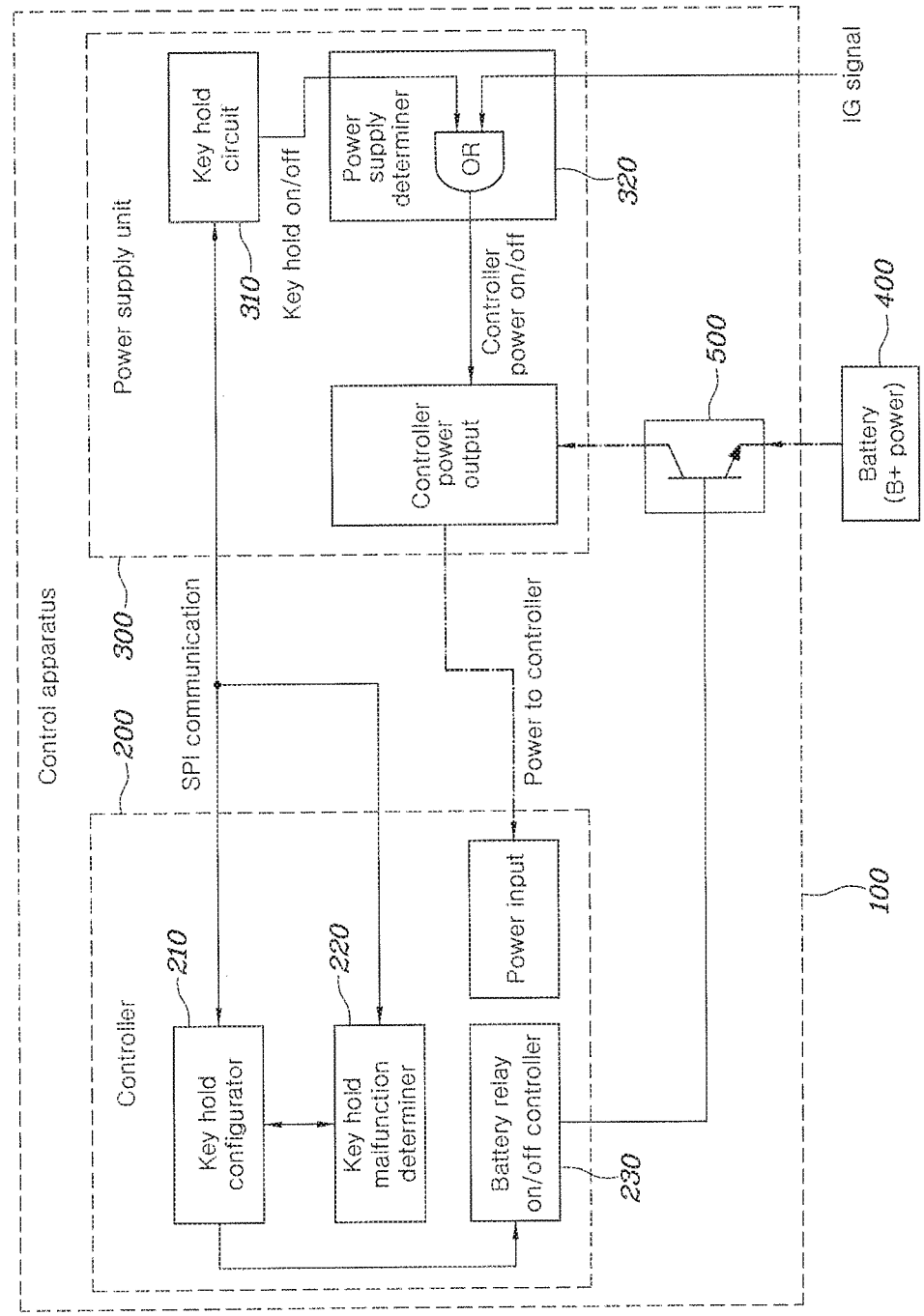
FIG. 1 is a block diagram of a control apparatus according to embodiments of the present disclosure.

It should be understood that the above-referenced drawings are not necessarily to scale, presenting a somewhat simplified representation of various preferred features illustrative of the basic principles of the disclosure. The specific design features of the present disclosure, including, for example, specific dimensions, orientations, locations, and shapes, will be determined in part by the particular intended application and use environment.

DETAILED DESCRIPTION OF THE EMBODIMENTS

Specific structural or functional descriptions of the embodiments of the present disclosure disclosed in the present specification or application are intended only for the purpose of explaining embodiments of the present disclosure, and the embodiments according to the present disclosure may be implemented in various forms and should not be construed as being limited to the embodiments set forth herein or in the application.

The embodiments according to the present disclosure may have various modifications and forms, and specific embodiments will be illustrated in the drawings and will be described in detail in the present specification or application. However, it should be understood that it is not intended to limit the embodiments according to the concepts of the present disclosure to specific forms of disclosure, but includes various modifications, equivalents, and alternatives falling within the spirit and scope of the present disclosure.

The terms "first" and/or "second" may be used to describe various elements, but the elements should not be limited to those terms. A first element may be referred to as a second element, and vice versa for the purpose of distinguishing one element from the other element without departing from the scope of the disclosure according to the concept of the present disclosure.

In the case where an element is referred to as being "connected" or "accessed" to other elements, it should be understood that not only the element is directly connected or accessed to the other elements, but also another element may exist between them. Meanwhile, in the case where a component is referred to as being "directly connected" or "directly accessed" to other component, it should be understood that there is no component therebetween. The other, expressions of describing a relation between structural elements, i.e. "between" and "merely between" or "neighboring" and "directly neighboring", should be interpreted similarly to the above description.

In the present specification, the terms are merely used to describe a specific embodiment, and are not intended to limit the present disclosure. As used herein, the singular forms are intended to include the plural forms as well, unless the context clearly indicates otherwise. In the description, it should be understood that the terms "include" or "have" indicate existence of a feature, a number, a step, an operation, a structural element, parts, or a combination thereof, and do not previously exclude the existences or probability of addition of one or more another features, numeral, steps, operations, structural elements, parts, or combinations thereof.

Unless defined differently, all terms used herein, which include technical terminologies or scientific terminologies, have the same meaning as that generally understood by a person skilled in the art to which the present disclosure belongs. It should be interpreted that the terms, which are identical to those defined in general dictionaries, have the meaning identical to that in the context of the related technique. The terms should not be ideally or excessively interpreted as a formal meaning unless not clearly defined.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuels derived from resources other than petroleum). As referred to herein, a hybrid vehicle is a vehicle that has two or more sources of power, for example both gasoline-powered and electric-powered vehicles.

Additionally, it is understood that one or more of the below methods, or aspects thereof, may be executed by at least one controller. The term "controller" may refer to a hardware device that includes a memory and a processor. The memory is configured to store program instructions, and the processor is specifically programmed to execute the program instructions to perform one or more processes which are described further below. The controller may control operation of units, modules, parts, or the like, as described herein. Moreover, it is understood that the below methods may be executed by an apparatus comprising the controller in conjunction with one or more other components, as would be appreciated by a person of ordinary skill in the art.

Furthermore, the controller of the present disclosure may be embodied as non-transitory computer readable media containing executable program instructions executed by a processor, controller or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed throughout a computer network so that the program instructions are stored and executed in a distributed fashion, e.g., by a telematics server or a Controller Area Network (CAN).

Hereinafter, embodiments of the present disclosure will be described detail with reference to the accompanying drawings. Like reference numerals denote like elements in the drawings.

Figure 2:
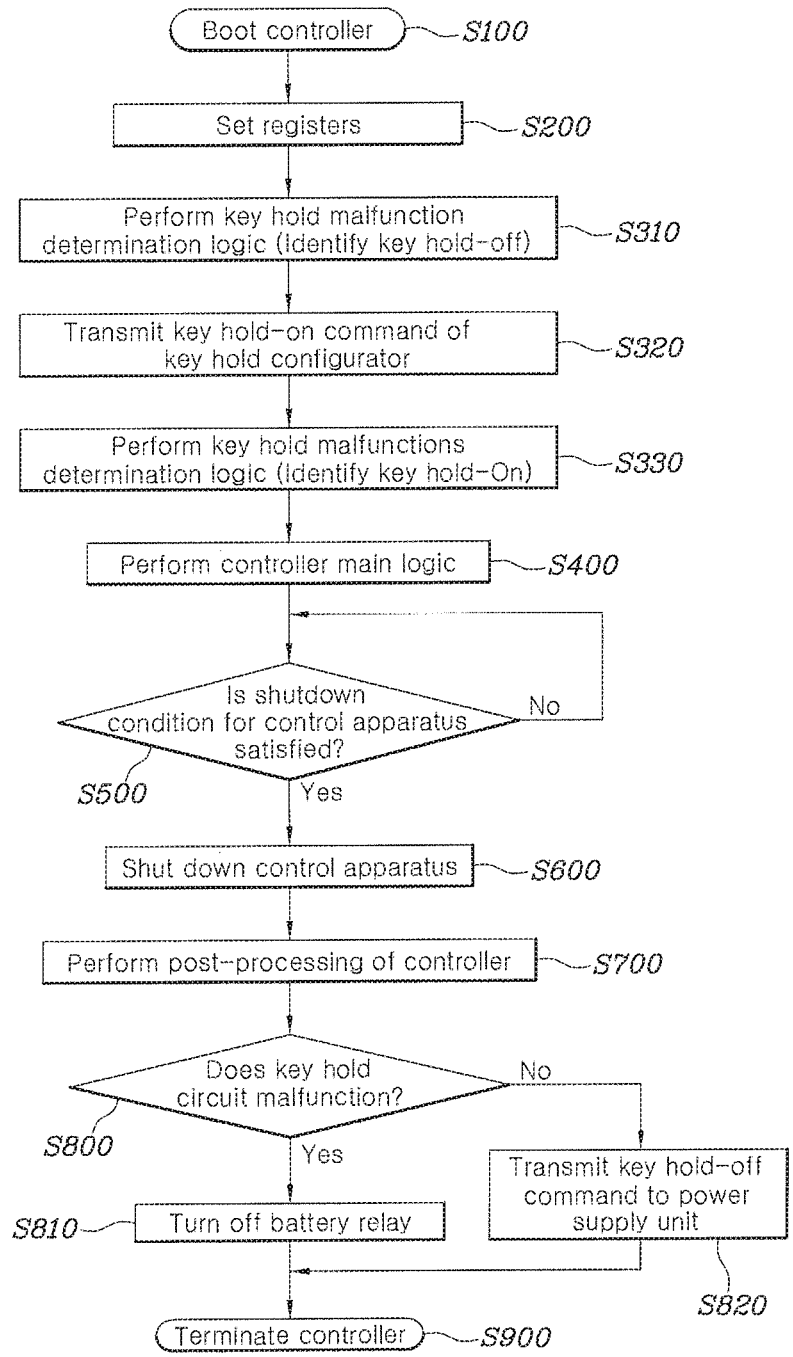
FIG. 2 is a flowchart illustrating a control procedure of a control apparatus according to embodiments of the present disclosure.

FIG. 1 is a block diagram of a control apparatus according to embodiments of the present disclosure, and FIG. 2 is a flowchart illustrating a control procedure of a control apparatus according to embodiments of the present disclosure.

As shown in FIGS. 1 and 2, a control apparatus 100 includes a controller 200 for performing a control operation function and a power supply unit 300 for supplying or cutting off power to the controller 200.

The controller 200 may be a central processing unit (CPU) capable of performing a control operation function of the control apparatus 100. More specifically, the controller 200 may enter a main function of the software (SW) and may perform a main function of the control apparatus 100. In addition, when power is supplied the controller 200 to then be booted while the controller 200 is turned off (S100), the controller 200 may perform setting of various registers of the control apparatus 100 (S200).

The power supply unit 300 may be included in the control apparatus 100, and may supply power to peripheral circuits, as well as the controller 200. More specifically, the power supply unit 300 may be supplied with power from a low-voltage battery (12V) 400 connected from the outside of the control apparatus 100, and may convert the power into the input rated power of the controller 200 to thus supply the same to the controller 200.

The controller 200 and the power supply unit 300 may be connected to each other through a serial peripheral interface (SPI), thereby transmitting and receiving signals. The SPI scheme is a system in which communication is performed in a 1:1 or 1:N master-slave mode as a synchronous serial data connection standard, which does not require a separate transmitter and enables communication through very simple hardware-interface processing.

The power supply unit 300 may include a key hold circuit 310 for storing the On/Off state of the key hold function of supplying power to the controller 200 after the control apparatus 100 shuts down and a power supply determiner 320 for determining whether or not to supply power to the controller 200.

The key hold function is intended to supply power to the controller 200 even after the control apparatus 100 shuts down, in which the controller 200 is supplied with power after the shutdown so as to perform predetermined post-processing (S700) and the power supply is cut off when the post-processing is complete (S810 and S820), thereby terminating the controller 200 (S900).

In the present disclosure, conditions for shutting down the control apparatus 100 (S500) may include turning off the ignition (IG Off) by a user or a driver or forced termination of the control apparatus 100 due to a failure inside the vehicle or external environment.

The post-processing of the controller 200 (S700) refers to a process of performing a predetermined control operation by the controller 200 after the shutdown of the control apparatus 100. For example, it may include on/off control of headlights when a general vehicle shuts down and control to remove a voltage from a main bus end (COD: Cathode Oxygen Depletion) or control of a cooling system when a fuel cell vehicle shuts down.

The key hold circuit 310 may store the on/off state of the key hold function. More specifically, the key hold circuit 310 may receive a command from a key hold configurator 210 of the controller 200, and may store the on/off state of the key hold function, thereby transmitting on/off signals of the key hold function to the power supply determiner 320 and the key hold malfunction determiner 220.

The power supply determiner 320 may determine whether to supply or cut off power to the controller 200 based on a user input signal or a key hold signal of the key hold circuit 310. The user input signal may refer to a vehicle ignition (IG)-on/off signal. The key hold signal of the key bold circuit 310 may be an on/off signal of the key hold function stored in the key hold circuit 310.

More specifically, the power supply determiner 320 may determine to supply power to the controller 200 when the user input signal is in the on state or the key hold signal of the key hold circuit 310 is in the on state. That is, the power supply determiner 320 may determine to supply power to the controller 200 when one of either the user input signal or the key hold signal of the key hold circuit 310 is in the On state according to the OR operation. If the user input signal is in the off state and the key hold signal of the key hold circuit 310 is in the off state, the power supply determiner 320 may determine to cut off the power supply to the controller 200.

The controller 200 may include a key hold configurator 210 for determining on/off conditions of the key hold function and transmitting a key hold-on/off command to the key hold circuit 310. The key hold configurator 210 may determine the on/off conditions of the key hold function according to a change in the ignition-on/off state of the control apparatus 100. For example, the controller 200 may transmit a key hold-on command to the key hold circuit 310 when the control apparatus 100 is turned on (S320). In the case of shutting down the control apparatus 100, the controller 200 may perform predetermined post-processing after the control apparatus 100 shuts down, and may then transmit a key hold-off command to the key hold circuit 310 (S820).

The controller 200 may include a key hold malfunction determiner 220 for detecting a malfunction of the key hold circuit 310. The key hold malfunction determiner 220 may identify the key hold-on/off state of the key hold circuit 310, and may detect a malfunction of the key hold circuit 310 based on the identified state.

The key hold malfunction determiner 220 of the controller 200 may detect a malfunction of the key hold function (S310 and S330). Malfunction of the key hold function may include a failure of the key hold circuit 310 or a failure of communication means between the controller 200 and the power supply unit 300. That is, the malfunction of the key hold function may mean that the key hold-on off state of the key hold circuit 310 is stored so as to be different from the key hold-on/off conditions and commands determined by the key hold configurator 210.

More specifically, the key hold malfunction determiner 220 may detect (S310) that the key hold function malfunctions if the key hold circuit 310 is in the key hold-on state before the transmission of a key hold-on command by the key hold circuit 310 (S320).

Alternatively, the key hold malfunction determiner 220 may determine (S330) that the key hold function malfunctions if the key hold circuit 310 is in the key hold-off state after the transmission of the key hold-on command by the key hold circuit 310 (S320).

It may be determined whether or not the key hold circuit 310 malfunctions (S310 and S330) after power is supplied to the controller 200 to then be booted (S100) and then setting of registers is completed (S200). Malfunction of the key hold function may be detected (S310 and S330) by checking the on/off state of the key hold circuit 310 before and after the key hold configurator 210 transmits a key hold-on command to the key hold circuit 310 (S320).

Figure 3:
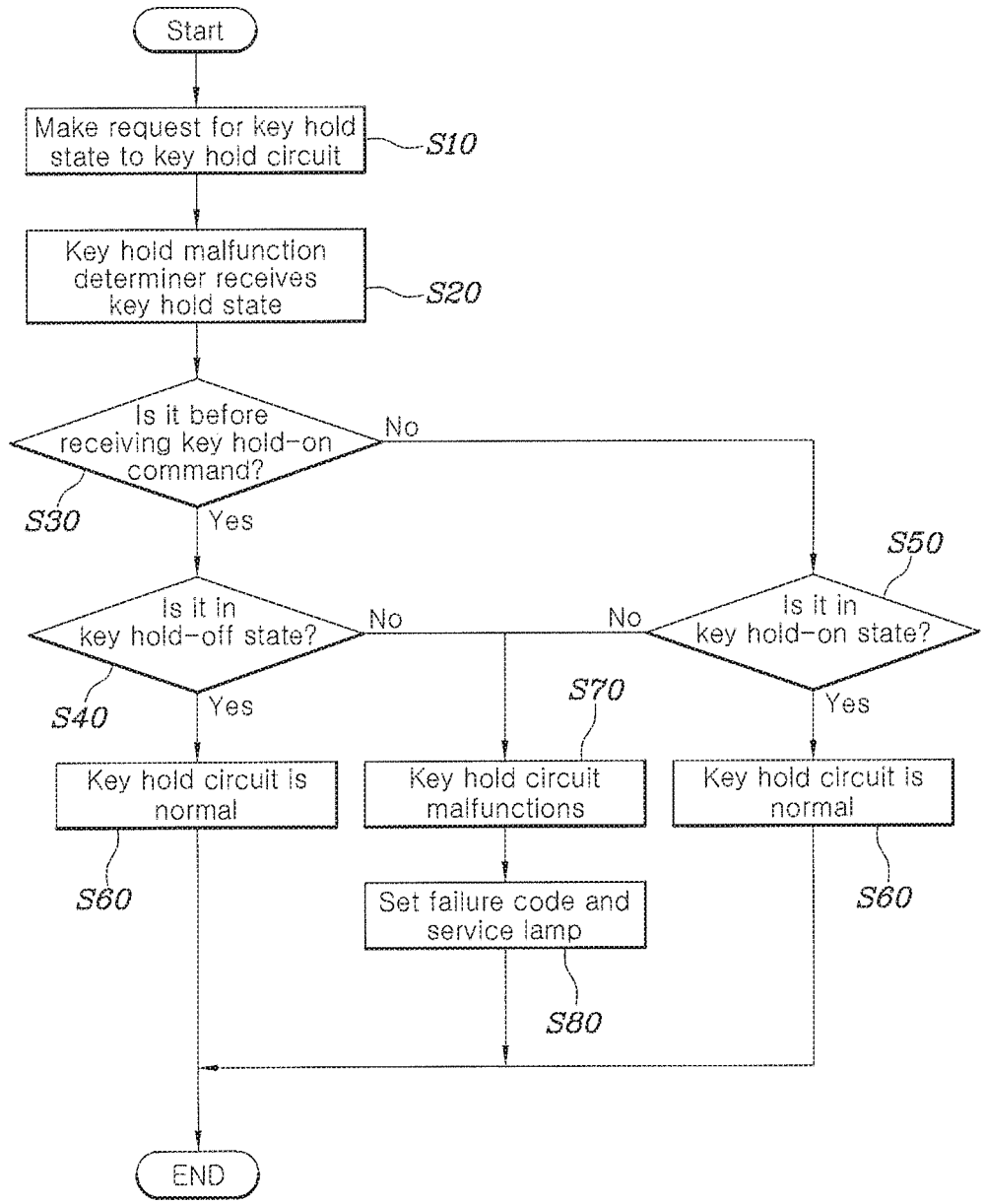
FIG. 3 is a flowchart for determining malfunction of a key hold function of a control apparatus according to embodiments of the present disclosure.

FIG. 3 is a flowchart for determining malfunction of a key hold function of a control apparatus according to embodiments of the present disclosure.

As shown in FIG. 3, the key hold malfunction determiner 220 of the controller 200 may make a request to the key hold circuit 310 of the power supply unit 300 for the key hold state (S10), and the key hold circuit 310 may transmit a key hold state signal to the key hold malfunction determiner 220 in response thereto (S20).

If the key hold circuit 310 is in the key hold-on state (S40) before transmission of a key hold-on command by the key hold configurator 210 (S30), the key hold malfunction determiner 220 may detect that the key hold function malfunctions (S70). It is normal that key hold circuit 310 is in the key hold-off state (S60) before the key hold configurator 210 transmits the key hold-on command to the key hold circuit 310 (S30). It is normal for the key hold circuit 310 to be in the key hold-off state when booting the controller 200, except for the exceptional case in which, the controller 200 is rebooted before the controller 200 completes the post-processing.

It is due to the fact that the key hold-on state of the key hold circuit 310 before receiving the key hold-on command means that the key hold circuit 310 has not received a key hold-off command from the key hold configurator 210 or that the key hold circuit 310 has received a key hold-off command but has not switched into the key hold-off state.

Alternatively, the key hold malfunction determiner 220 may detect that the key hold function malfunctions (S70) if the key hold circuit 310 is in the key hold-off state (S50) after receiving the key hold-on command from the key hold configurator 210 (S30). It is normal for the key hold circuit 310 to switch into the key hold-on state after receiving the key hold-on command from the key hold configurator 210 (S60). If the key hold circuit 310 is in the key hold-off state even though the key hold configurator 210 has transmitted the key hold-on command, it may be detected that the key hold function malfunctions due to a failure of the key hold circuit 310 or a failure of communication between the controller 200 and the power supply unit 300.

If it is detected that the key hold function malfunctions (S70), a failure code may be set in a non-volatile memory of the control apparatus 100, and the user may be notified of the same through blinking of the lamp (S80). Accordingly, the user may recognize malfunction of the key hold function and may repair the key hold function.

Referring back to FIGS. 1 and 2, the controller 200 may perform predetermined main logic (S400) after the step of determining malfunction of the key hold function (S310 and S330).

A battery 400 may be further provided outside the control apparatus 100 in order to supply power to the power supply unit 300 of the control apparatus 100, and the controller 200 of the control apparatus 100 may include a battery relay-on/off controller 230 for controlling the on/off state of a battery relay 500 provided between the battery 400 and the power supply unit 300.

The battery 400 may be a low-voltage battery (12V), and may supply power to the power supply unit 300 of the controller 200, thereby supplying power to the controller 200 and other peripheral circuits of the control apparatus 100. The battery relay 500 may be provided between the battery 400 and the power supply unit 300. The battery relay 500 may be a MOSFET relay that connects or disconnects power between the battery 400 and the power supply unit 300. The battery relay 500 may be provided between a positive electrode (B+) of the battery 400 and the power supply unit 300.

In the normal case, the power supply determiner 320 may determine whether or not to supply or cut off power to the controller 200 from the battery 400 to thus control the power supply to the controller 200 while the battery relay 500 maintains the power supply between the battery 400 and the power supply unit 300 (S820). However, in the abnormal case in which, for example, the key hold function malfunctions (S800), the power supply from the battery 400 to the power supply unit 300 may be forcibly cut off using the battery relay 500 (S810).

If the key hold malfunction determiner 220 determines that the key hold function malfunctions, the battery relay-on/off controller 230 may perform control so as to turn off the battery relay 500 when the controller 200 completes execution of predetermined operation after the shutdown of the control apparatus 100 (S810).

If the key hold malfunction determiner 220 determines that the key hold function malfunctions due to a failure of the key hold circuit 310 or a failure of communication means between the controller 200 and the power supply unit 300 (S800), even if the key hold configurator 210 transmits a key hold-off command, the key hold circuit 310 cannot turn off the key hold function. Accordingly, when the controller 200 completes predetermined post-processing (S700), the battery relay 500 may be turned off (S810) to thereby prevent continuous supply of power from the battery 400 to the controller 200 after the control apparatus 100 shuts down.

If the key hold malfunction determiner 220 determines that the key hold function is normal (S800), the key hold configurator 210 may transmit a key hold-off command to the key hold circuit 310. Accordingly, the power supply determiner 320 may perform control so as to cut off the power supply from the power supply unit 300 to the controller 200 (S820).

Referring to FIG. 2, a control method of a control apparatus according to embodiments of the present disclosure includes: booting a controller 200 (S100); determining malfunction of a key hold function of supplying power to the controller 200 after the control apparatus 100 shuts down (S310 and S330); and if it is detected that the key hold function malfunctions (S800), turning off a battery relay 500 (S810) provided between a battery 400 and a power supply unit 300 for supplying power to the controller 200 when the controller 200 completes a predetermined operation (S700) after the control apparatus 100 shuts down.

In the step of detecting a malfunction of the key hold function (S310), it may be determined that the key hold function malfunctions if the key hold circuit 310 is in the key hold-on state before receiving a key hold-on command from the key hold configurator 210 (S320).

In the step of detecting malfunction of the key hold function (S330), it may be determined that the key hold function malfunctions if the key hold circuit 310 is in the key hold-off state after receiving the a hold-on command from the key hold configurator 210 (S320).

The description the same as that of the control apparatus will be omitted.

Although the present disclosure has been described and illustrated with reference to the certain embodiments thereof, it will be apparent to those skilled in the art that various improvements and modifications of the present disclosure can be made without departing from the technical idea of the present disclosure provided by the following claims.

What is claimed is:

1. A control apparatus of a vehicle comprising:
   a controller configured to control an operation function of the vehicle; and
   a power supply unit configured to supply power to the controller or to cut off power supply thereto,
   wherein the power supply unit comprises a) a key hold circuit configured to store a key hold-on/off state of the key hold circuit corresponding to a key hold function of supplying power to the controller after the control apparatus shuts down and b) a power supply determiner configured to determine whether to supply the power to the controller,
   wherein the key hold circuit is connected to the power supply determiner of the power supply unit,
   wherein the controller comprises a key hold malfunction determiner detecting a malfunction of the key hold function,
   wherein the key hold malfunction determiner identifies the key hold-on/off state of the key hold circuit and detects the malfunction of the key hold function based on the identified key hold-on/off state,
   wherein the controller comprises a key hold configurator configured to determine on/off conditions of the key hold function and transmit a key hold-on/off command to the key hold circuit,
   wherein the key hold malfunction determiner is connected to the key hold configurator to detect that the key hold function malfunctions when the key hold circuit is in the on state before receiving a key hold-on command from the key hold configurator, and
   wherein the key hold malfunction determiner and the key hold configurator of the controller are connected to the power supply unit.

2. The control apparatus of claim 1, wherein the power supply determiner determines whether to supply the power to the controller based on a user input signal or the key hold-on/off state of the key hold circuit.

3. The control apparatus of claim 2, wherein the power supply determiner determines to supply the power to the controller when the user input signal is in the on state or the key hold circuit is in the on state.

4. The control apparatus of claim 2, wherein the power supply determiner determines to cut off the power supply to the controller when the user input signal is in the off state and the key hold circuit is in the off state.

5. The control apparatus of claim 1, wherein the key hold configurator transmits a key hold-off command to the key hold circuit when the controller completes execution of a predetermined operation after the control apparatus shuts down.

6. The control apparatus of claim 1, wherein:
   the controller comprises a key hold configurator determining on/off conditions of the key hold function and transmitting a key hold-on/off command to the key hold circuit, and
   the key hold malfunction determiner detects that the key hold function malfunctions when the key hold circuit is in the off state after receiving a key hold-on command from the key hold configurator.

7. The control apparatus of claim 1, further comprising a battery configured to supply power to the power supply unit, wherein the controller comprises a battery relay-on/off controller configured to control an on/off switch of a battery relay provided between the battery and the power supply unit.

8. The control apparatus of claim 7, wherein:
   the controller comprises a key hold malfunction determiner detecting a malfunction of the key hold function, and
   when the key hold malfunction determiner detects that the key hold function malfunctions, a battery relay-on/off controller controls the battery relay turn off the battery relay when the controller completes execution of a predetermined operation after the control apparatus shuts down.

9. The control apparatus of claim 1, wherein the controller is connected to the power supply unit by a serial peripheral interface (SPI), and the controller and the power supply unit transmit signals to each other via the connection.

10. A method for controlling a control apparatus of a vehicle, the method comprising:
    booting a controller configured to control an operation function of the vehicle;
    detecting a malfunction of a key hold function of supplying power to the controller by a power supply unit after the control apparatus shuts down; and
    when the malfunction of the key hold function is detected, controlling a battery relay, which is provided between a battery and a power supply unit for supplying power to the controller, to turn off the battery relay when the controller completes execution of a predetermined operation after the control apparatus shuts down,
    wherein the detecting of the malfunction of the key hold function comprises detecting that the key hold function malfunctions when a key hold circuit is in a key hold-on state before transmission of a key hold-on command by a key hold configurator, and
    wherein the controller comprises the key hold configurator configured to determine on/off conditions of the key hold function and transmit a key hold-on/off command to the key hold circuit.

11. The method of claim 10, wherein the detecting of the malfunction of the key hold function comprises detecting that the key hold function malfunctions when a key hold circuit is in a key hold-off state after transmission of a key hold-on command by a key hold configurator.

* * * * *